US009136289B2

(12) United States Patent
Tam (10) Patent No.: US 9,136,289 B2
(45) Date of Patent: Sep. 15, 2015

(54) CAMERA MODULE HOUSING HAVING BUILT-IN CONDUCTIVE TRACES TO ACCOMMODATE STACKED DIES USING FLIP CHIP CONNECTIONS

(75) Inventor: Samuel Tam, Daly City, CA (US)

(73) Assignee: Flextronics AP, LLC, Broomfield, CO (US)

( * ) Notice: Subject to any disclaimer, the term of this patent is extended or adjusted under 35 U.S.C. 154(b) by 423 days.

(21) Appl. No.: 13/215,340

(22) Filed: Aug. 23, 2011

(65) Prior Publication Data
US 2013/0050571 A1    Feb. 28, 2013

(51) Int. Cl.
*H01L 27/146* (2006.01)
*H04N 5/225* (2006.01)

(52) U.S. Cl.
CPC .... *H01L 27/14618* (2013.01); *H01L 27/14636* (2013.01); *H01L 27/14683* (2013.01); *H04N 5/2257* (2013.01); *H01L 27/14625* (2013.01); *Y10T 29/49002* (2015.01)

(58) Field of Classification Search
CPC . H04N 5/2251; H04N 5/2252; H04N 5/2253; H04N 5/2254; H04N 5/2257; H01L 27/14618; H01L 27/14625; H01L 27/14636
USPC ................................ 348/373–376; 250/208.1
See application file for complete search history.

(56) References Cited

U.S. PATENT DOCUMENTS

| | | | |
|---|---|---|---|
| 5,754,621 A | 5/1998 | Suzuki et al. | |
| 7,167,376 B2 * | 1/2007 | Miyashita et al. | 361/761 |
| 7,262,405 B2 * | 8/2007 | Farnworth et al. | 250/239 |
| 7,304,684 B2 * | 12/2007 | Segawa et al. | 348/374 |
| 7,619,684 B2 | 11/2009 | Nishida et al. | |
| 7,682,159 B2 * | 3/2010 | Huang et al. | 439/71 |
| 2001/0055073 A1 | 12/2001 | Shinomiya | |
| 2005/0007481 A1 | 1/2005 | Yamaguchi et al. | |
| 2005/0199998 A1 | 9/2005 | Chen et al. | |
| 2006/0043260 A1 | 3/2006 | Ma et al. | |
| 2006/0132644 A1 | 6/2006 | Shangguan et al. | |
| 2007/0064317 A1 * | 3/2007 | Chen et al. | 359/811 |
| 2007/0210246 A1 * | 9/2007 | Ellenberger et al. | 250/239 |
| 2007/0228403 A1 * | 10/2007 | Choi et al. | 257/98 |
| 2008/0093721 A1 * | 4/2008 | Kang et al. | 257/680 |
| 2009/0033790 A1 * | 2/2009 | Lin | 348/374 |
| 2010/0039553 A1 * | 2/2010 | Kim et al. | 348/374 |
| 2010/0328525 A1 * | 12/2010 | Lee et al. | 348/374 |
| 2011/0050979 A1 | 3/2011 | Rudmann | |
| 2011/0121666 A1 | 5/2011 | Park et al. | |
| 2011/0286736 A1 * | 11/2011 | Aizawa et al. | 396/529 |
| 2012/0018830 A1 * | 1/2012 | Lin et al. | 257/432 |
| 2012/0038803 A1 * | 2/2012 | Tsai | 348/294 |
| 2012/0068292 A1 * | 3/2012 | Ikeda et al. | 257/432 |
| 2012/0104524 A1 * | 5/2012 | Takeshita et al. | 257/432 |
| 2012/0141114 A1 * | 6/2012 | Gooi et al. | 396/529 |

* cited by examiner

Primary Examiner — Timothy J Henn
(74) Attorney, Agent, or Firm — Haverstock & Owens LLP (57) ABSTRACT

A camera module including a housing with embedded conductive traces that allow for an increase in usable surface area of a corresponding printed circuit board (PCB) or multi-layer substrate, a reduced overall thickness of the module, a reduction in tilt management of a lens element of the module, and a facilitation in alignment of the lens element relative to the image sensor. An image sensor is electrically interconnected to first portions of the conductive traces by way of a flip chip process, and then the housing may be mounted over the PCB so that second portions of the conductive traces interconnect with corresponding conductive pads on the PCB to electrically interconnect the image sensor die to the PCB. In one arrangement, another die may be electrically interconnected to the PCB so that as assembled, the die is disposed between the image sensor and the PCB.

21 Claims, 3 Drawing Sheets

CAMERA MODULE HOUSING HAVING BUILT-IN CONDUCTIVE TRACES TO ACCOMMODATE STACKED DIES USING FLIP CHIP CONNECTIONS

BACKGROUND

Digital camera technology is being used in an increasing variety of mass-produced applications. A growing use of digital camera technology is incorporating or providing fixed-focus camera modules in consumer products such as wireless telephones, cell phones, personal digital assistants (PDAs), and other handheld electronic devices. While many consumers demand high-end functionality and quality, many consumers want the functions such as those provided by a digital camera but at affordable prices. For instance, it is estimated that that more than 65 percent of cell phones will include cameras. Additionally, there are many companies that produce consumer products such as cell phones and PDAs, and this competition requires that components including camera modules be produced with high quality but at acceptable costs with lower per unit material and assembly costs. This is especially true for products in which the camera is a secondary component such as when the product is primarily a communication device.

Fixed-focus camera modules used in many consumer products generally include a lens for focusing incoming light onto an image sensor that detects an image and converts it into an electrical signal representation. An image processor manipulates the image signal into an image that is stored or displayed on a display screen. Camera modules also include a chassis and enclosure for mounting the various electronic and optical components and for protecting the components from particulate and spurious light contamination.

Figure 1:
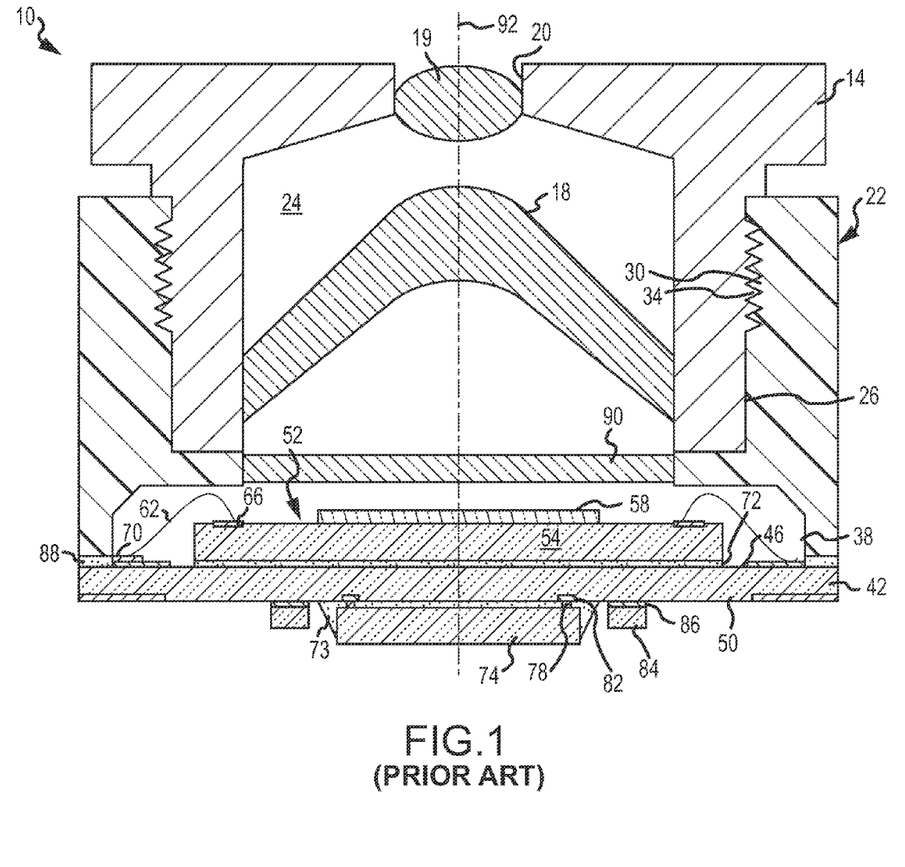
FIG. 1 is a side view of a camera module assembly according to the prior art.

Turning to FIG. 1, a conventional camera module 10 is illustrated that may be used to provide digital imaging functionality in a consumer product or application such as a wireless or cellular phone, tablet computer, and the like. The module 10 is a "double-die" version in which a number of dies or substrates are generally arranged on opposing surfaces of a printed circuit board assembly (PCBA) along a single axis. As shown, the module 10 includes a housing 22 (e.g., constructed of thermoplastic polymer such as polyvinyl chloride or PVC) having an internal cavity 24 with a first portion 26 that is adapted to receive a corresponding portion of a lens barrel 14 having at least one lens element 18 (via respective threaded portions 30, 34 on the housing 22 and lens barrel 14) and a second portion 38 that is adapted to receive and/or interconnect with a number of dies and other components that are generally collectively operable to receive and process incoming light passing through the lens element 18 to store and/or display a corresponding image. An infrared (IR) filter for filtering longer-wavelength radiation to limit noise created in an image sensor 58 is disposed within the internal cavity. Any appropriate transparent lens cover 19 may be disposed within or over an aperture 20 in the lens barrel 14 to allow the lens element 18 to receive light while protecting the lens element 18 and other components of the module 10 from particulates and other debris.

The module 10 includes a PCBA 42 (e.g., a multi-layer substrate) having first and second opposing surfaces 46, 50 for receiving one or more components and dies. An image sensor 52 including a first die 54 and an imaging chip 58 (e.g., CMOS chip) is electrically interconnected to the PCBA 42 by way of laying the first die 54 over the first surface 46 and bonding both ends of one or more pairs of wires 62 (e.g., gold) to respective contact pads 66, 70 on the first die 54 and the first surface 46 of the PCBA 42. An underfill such as a non-conductive paste (NCP) 72 is disposed between the first surface 46 and the first die 54 to further secure the first die 54 to the first surface 46.

A second die 74 (e.g., JPEG or graphics chip) is electrically interconnected to the second surface 50 of the PCBA 42 by way of a flip chip connection. More specifically, the second die 74 includes at least a pair of stud or solder bumps 78 that are spaced to align with a corresponding spaced pair of contact pads 82 on the second surface 50 of the PCBA 42. Upon flipping the second die 74 upside down and aligning the solder bumps 78 with the contact pads 82, flowing of the solder bumps 78 completes the electrical interconnect between the second die 74 and the PCBA 42. Again, NCP 73 is disposed between the second surface 50 and the second die 74 to further secure the second die 74 to the second surface 50. Furthermore, one or more surface mount technology (SMT) passive components 84 are electrically interconnected to the second surface 50 of the PCBA 42 via respective contact pads 86.

To assemble the module 10, the PCBA 42 is arranged so that the first die 54 is inserted into or otherwise disposed in the second portion 38 of the internal cavity 24 and faces the lens element 18 and an epoxy 88 is used to connect the PCBA 42 (e.g., via the first surface 46) to the housing 22. Also, the lens barrel 14 is threaded into the first portion 26 to a position whereby the lens element 18 is accurately focused on the imaging chip 58. As shown, the lens element 18, IR filter 90, imaging chip 58, first die 54, PCBA 42 and second die 74 are generally arranged so that their centers (not labeled) lie along an axis 92. The module 10 may be incorporated into a consumer product and appropriately interconnected to the system controller or processing unit of the product.

Mounting of first and second dies or substrates (e.g., first and second dies 54, 74) over opposing surfaces of a PCBA (e.g., over first and second surfaces 46, 50 of PCBA 42) has the drawback of reducing the surface area of the PCBA 42 that can be utilized by other dies and components. Furthermore, this arrangement has the negative effect of increasing the overall thickness of the module 10 (e.g., generally the distance between a top of the lens barrel 14 and the bottom of the second die 74) which reduces the ability of the module 10 to be incorporated into consumer products of ever-decreasing size.

As an additional corollary, with increased thickness comes an increased focal length (i.e., the distance between the lens element 18 and the imaging chip 58 assuming the lens element 18 is positioned to focus light rays on the imaging chip 58) of the optical arrangement of the module 10 which results in a corresponding increase in tilt management (i.e., the management of rotation of the lens plane relative to the image plane). Still further, as the image sensor 52 is mounted to the PCBA 42, the PCBA 42 must be precisely mounted to the housing 22 to correspondingly ensure that the imaging chip 58 is precisely aligned with the lens element 18 (e.g., along axis 92). In this regard, the interconnection between the PCBA 42 and the housing 22 is generally associated with relatively low tolerances.

SUMMARY

Disclosed herein is a camera module for use in electronic devices and including a housing having generally opposing first and second portions. The first portion includes an outer surface, an inner surface, and a first housing cavity that is surrounded by the inner surface, and the second portion includes an outer surface, an inner surface, and a second housing cavity that is surrounded by the inner surface. A lens barrel having at least one lens element disposed therein is interconnected to the first portion of the housing so that the at least one lens element is receivable within the first housing cavity. The camera module also includes at least first and second conductive traces extending along the inner surface of the second portion of the housing. At least one die piece having an imaging chip is disposed within the second cavity and is electrically interconnected to the first and second conductive traces, and a substrate is electrically interconnected to the first and second conductive traces and separated from the at least one die piece.

Each of the first and second conductive traces may be at least partially embedded within the housing. For instance, each of the first and second conductive traces may be at least partially free of exposure via the inner surface. That is, each of the conductive traces may have portions that are not available to be directly electrically interconnected to another conductive member. In one arrangement, the housing may be a molded interconnect device (MID).

The at least one die piece may include a first surface facing the lens element and an opposing second surface facing the substrate, and the at least one die piece may be electrically interconnected to the first and second conductive traces via respective first and second conductive components extending between the first opposing surface and the first and second conductive traces. For instance, the first and second conductive components may include first and second stud bumps.

The imaging chip may be disposed over the first opposing surface between the first and second conductive components. In one arrangement, the at least one die piece may be a first die piece, and the module may include a second die piece having a first surface facing the lens element and an opposing second surface facing the substrate. For instance, the second die piece may be electrically interconnected to the substrate via third and fourth conductive components (e.g., stud bumps) extending between the second opposing surface and the substrate. Here, the second die piece may be disposed between the first die piece and the substrate and/or may be spaced from the first die piece. Each of the lens element, imaging chip and substrate may be generally aligned with an axis of the lens element. For instance, each of the lens element, imaging chip and substrate may be generally symmetrically disposed about the axis.

Also disclosed herein is a camera module for use in electronic devices and including a housing having a tubular body with opposing first and second ends, opposing inner and outer surfaces, and an internal cavity surrounded by the inner surface. The housing also includes a ledge extending from the inner surface into the internal cavity to form first and second portions of the internal cavity that are respectively bordered by the first and second opposing ends of the tubular body and the ledge. The camera module also has an image sensor disposed within one of the first and second portions and interconnected to the ledge, and a substrate interconnected to the one of the first and second opposing ends that borders the one of the first and second portions.

In one arrangement, the camera module may include a first conductive trace that electrically interconnects the image sensor to the substrate, and a second conductive trace that electrically interconnects the image sensor to the substrate. Each of the first and second conductive traces may follow a contour of the inner surface of the tubular body and the ledge. For instance, each of the first and second conductive traces may be at least partially embedded in the housing. In one variation, a die may be electrically interconnected to the substrate and disposed between the image sensor and the substrate. For instance, first and second conductive components (e.g., stud bumps) may respectively interconnect the first and second conductive traces and the image sensor, and third and fourth conductive components (e.g., stud bumps) may respectively interconnect the die and the substrate.

The tubular body may include a rectangular cross-section adjacent the one of the first and second portions of the internal cavity and a circular cross-section adjacent the other of the first and second portions of the internal cavity. A lens barrel having at least one lens element disposed therein may be receivable within the other of the first and second portions of the internal cavity.

Also disclosed herein is a method of building a camera module for use in electronic devices. The method includes providing a housing (e.g., an MID) having a tubular body, an internal cavity within the tubular body, a mounting surface extending from an inner surface of the tubular body into the internal cavity, a first conductive member extending along both the mounting surface and the inner surface, and a second conductive member extending along both the mounting surface and the inner surface. The method also includes mounting an image sensor to the mounting surface over first portions of the first and second conductive members, and bonding the housing onto a substrate to electrically interconnect the image sensor to the substrate via the first and second conductive members.

The mounting may include performing a flip chip process between the image sensor and the first portions of the first and second conductive members. The performing may include aligning first and second conductive bumps on the image sensor with the first portions of the first and second conductive members, respectively, and flowing the first and second conductive bumps (e.g., via a thermo-compression bonding process) to form an electrical connection between the image sensor and the first and second conductive members. A non-conductive paste may be disposed over the first and second conductive bumps, and the thermo-compression bonding process may be performed on the non-conductive paste. The bonding may include applying a conductive material (e.g., epoxy) onto at least one of the substrate and second portions of the first and second conductive members, and contacting the substrate with the second portions of the first and second conductive members.

The tubular body may include opposing first and second ends, and the bonding may include bonding one of the opposing first and second ends of the tubular body onto the substrate. Each of the first and second conductive members may extend along the one of the opposing first and second ends, the first portions of the first and second conductive members may be disposed between the image sensor and the mounting surface, and another portion of the first and second conductive members may be disposed between the one of the opposing first and second ends and the substrate. Here, the bonding may include contacting the another portion of each of the first and second conductive members with corresponding conductive pads on the substrate. A lens barrel including at least one lens element may be inserted into the internal cavity via the other of the opposing first and second ends.

DETAILED DESCRIPTION

While the invention is susceptible to various modifications and alternative forms, specific embodiments thereof have been shown by way of example in the drawings and are herein described in detail. It should be understood, however, that it is not intended to limit the invention to the particular form disclosed, but rather, the invention is to cover all modifications, equivalents, and alternatives falling within the scope and spirit of the invention as defined by the claims.

Figure 2:
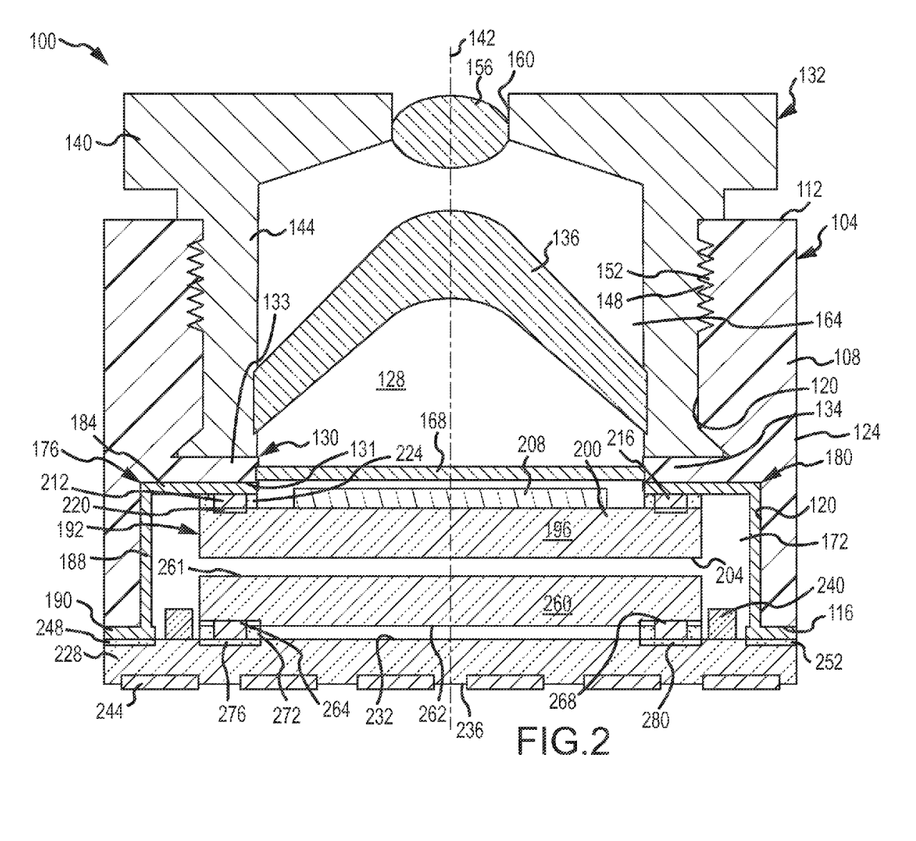
FIG. 2 is a side view of a camera module assembly according to one embodiment.

FIG. 2 illustrates a side view of a camera module 100 according to one embodiment. As will be understood in more detail in the discussion that follows, the camera module 100 is arranged to increase the usable surface of a PCBA (e.g., free of increasing the size of a PCBA), reduce the overall thickness of a PCBA, reduce the degree of tilt management of the lens plane relative to the image plane, and facilitate the precise alignment of an image sensor with a corresponding lens element, all in relation to conventional camera modules. The camera module 100 generally includes a housing 104 (e.g., a one-piece unit constructed of a thermoplastic polymer such as polyvinyl chloride or PVC) having a tubular body 108 with opposing first and second (e.g., free) ends 112, 116, opposing inner and outer surfaces 120, 124, an internal cavity 128 surrounded by the inner surface 120, and a ledge or projection 130 extending from the inner surface 120 of the tubular body 108 into the internal cavity 128 and extending generally circumferentially about the inner surface 120.

The module 100 also may include a lens barrel 132 having at least one lens element 136 that is reciprocally receivable in the internal cavity 128 generally along an axis 142 (e.g., corresponding to a lens axis of the lens element 136 whereby the lens element 136 is generally symmetrically disposed about the axis 142) to move the lens element 136 towards or away from an image sensor 192. In one arrangement, the lens barrel 132 may include a base 140 and a cylindrical or tubular sidewall 144 extending from the base 140 and having the lens element 136 mounted thereto in any appropriate manner. As one non-limiting example, a first threaded surface 148 on the sidewall 144 may threadingly engage with corresponding second threaded surface 152 on the inner surface 120 of the tubular body 108. Any appropriate transparent lens cover 156 may be disposed within or over an aperture 160 in the base 140 to allow the lens element 136 to receive light while protecting the lens element 136 and other components of the module 100 from particulates and other debris.

The lens barrel 132 may be disposed within a first housing cavity 164 (e.g., a first portion) of the internal cavity 128 that is generally bordered by the first end 112 of the tubular body 108. An infrared (IR) filter 168 for filtering longer-wavelength radiation to limit noise created in the image sensor 192 may also be disposed within the internal cavity 128 between the lens element 136 and the image sensor 192. In one arrangement, the IR filter 168 may be appropriately bonded or otherwise attached to the projection 130 (e.g., to an inner surface of the projection 130 as shown in FIG. 2 and/or, in other embodiments, to an upper surface of the projection 130 generally facing the lens element 136). Furthermore, a second housing cavity 172 (e.g., a second portion) of the internal cavity 128 that is generally bordered by the second end 116 of the tubular body 108 and generally separated from the first housing cavity 164 by the projection 130 may be adapted to receive and/or interconnect with a number of dies and/or other components that are generally collectively operable to receive and process incoming light passing through the lens element 136 to store and/or present a corresponding image (e.g., on a display of a corresponding electronic device such as a smartphone, tablet computer, etc.). In one arrangement, the tubular body 108 may have a substantially circular cross-section adjacent the first housing cavity 164 and a substantially rectangular or square cross-section adjacent the second housing cavity 172. That is, the tubular body 108 may have a non-constant cross-sectional shape between the first and second ends 112, 116. In other arrangements, the tubular body 108 may have other combinations of cross-sectional shapes or even the same cross-sectional shape between the first and second ends 112, 116.

As shown, the housing 104 may include at least first and second conductive members or traces 176, 180 disposed generally adjacent the second housing cavity 172 and each extending along at least a portion of the inner surface 120 of the tubular body 108 for use in electrically interconnecting the image sensor 192 or other die to a PCBA 228 as will be discussed in more detail below. For instance, each of the first and second conductive traces 176, 180 may be at least partially embedded within the housing 104 in any appropriate manner. In one arrangement, the housing 104 may be a molded interconnect device (MID) having the first and second conductive traces 176, 180 integrated therein as part of an injection molding process. Although the following discussion will be in the context of first and second conductive traces 176, 180, it should be understood that any appropriate number of conductive traces (e.g., 12, 24, 48, etc.) may be utilized to allow for efficient electrical communication between the image sensor 192 and the PCBA 228.

For example, each of the first and second conductive traces 176, 180 may have a first portion 184 extending along a mounting surface 131 of respective first and second portions 133, 134 of the projection 130, a second portion 188 extending along respective portions of the inner surface 120 of the tubular body 108 from the first portion 184 towards the second end 116 of the tubular body 108, and a third portion 190 extending at least partially along the second end 116 of the tubular body 108 (the first, second and third portions 184, 188, 190 have only been labeled for the first conductive trace 176 in the interest of clarity). In this regard, each of the first and second conductive traces 176, 180 may provide an electrical path from the mounting surface 131 of the projection 130 and along or adjacent the inner surface 120 towards the second end 116 of the tubular body 108. The first and second portions 133, 134 of the projection 130 may either be integrally connected (e.g., formed as one-piece) or may be independent and separate components.

With continued reference to FIG. 2, the image sensor 192 may be disposed within the second housing cavity 172 along axis 142 and electrically interconnected to the first and second conductive traces 176, 180 for use in receiving light focused by the lens element 136 and passing corresponding electrical signals via the first and second conductive traces 176, 180 to PCBA 228. For instance, the image sensor 192 may include an image sensor die or die piece 196 (e.g., substrate) having first and second opposing surfaces 200, 204 and an imaging chip 208 appropriately mounted on the first opposing surface 200 in a manner so as to face the lens element 136. While shown as two separate pieces or components, other embodiments envision that the imaging chip 208 may be embedded within or formed as one piece with the image sensor die 196.

In any case, first and second conductive components (or additional conductive components in the event there are more than first and second conductive traces 176, 180) such as first and second stud bumps 212, 216 (e.g., conductive studs) constructed of any appropriate material (e.g., gold) may be respectively interconnected between the first opposing surface 200 of the image sensor die 196 and the first portions 184 of the first and second conductive traces 176, 180. For instance, each of the first and second stud bumps 212, 216 may be initially deposited over a corresponding conductive pad 220 on the first opposing surface 200. Furthermore, the first and second stud bumps 212, 216 may be spaced apart from each other by an amount that allows the first and second stud bumps 212, 216 to align with the first portions 184 of the first and second conductive traces 176, 180. In one arrangement, each first portion 184 of the first and second conductive traces 176, 180 may have any appropriate feature or component (e.g., line, mark, pad) associated therewith so that upon alignment of the first and second stud bumps 212, 216 with such features or components and appropriate interconnection thereto, the imaging chip 208 may be automatically aligned with the lens element 136 along the axis 142. That is, the imaging chip 208 may be automatically appropriately positioned to receive light rays focused by the lens element 136 thereon upon alignment of the first and second stud bumps 212, 216 with such features or components and interconnection to the first portions 184 of the first and second conductive traces 176, 180.

In one arrangement, the image sensor 192 may be electrically interconnected to the first and second conductive traces 176, 180 using a flip chip process. For instance, the image sensor 192 may be flipped over or otherwise oriented so that the first and second stud bumps 212, 216 are aligned with the first portions 184 of the first and second conductive traces 176, 180 (or the marks or other features on the first portions 184). Thereafter, a thermo-compression bonding process may be utilized to heat, compress and flow the first and second stud bumps 212, 216 between the imaging sensor die 196 and the first portions 184 of the first and second conductive traces 176, 180. The flowing and compression of the first and second stud bumps 212, 216 may cause the first and second stud bumps 212, 216 to spread out (e.g., in a direction generally perpendicular to the axis 142) and thereby increase the surface area of the first portions 184 of the first and second conductive traces 176, 180 in contact with the surface area of the imaging sensor die 196 and thereby improve the electrical interconnection between the image sensor 192 and the first and second conductive traces 176, 180. In one variation, each of the first and second stud bumps 212, 216 may have any appropriate underfill such as non-conductive paste (NCP) 224 disposed thereover for use in further securing and stabilizing the image sensor 192 to the first and second conductive traces 176, 180 and first and second portions 133, 134 of the projection 130. In this regard, the thermo-compression bonding process may also serve to heat and compress the NCP 224 between the image sensor 192 and the first and second conductive traces 176, 180.

The module 100 may also include the PCBA 228 or other multi-layer substrate having first and second opposing surfaces 232, 236 in addition to one or more components such as SMT passive components 240, land grid array (LGA) pads 244, processors (not shown), memory modules (not shown), and/or the like. The housing 104 and electrically interconnected image sensor 192 may be interconnected to the PCBA 228 in a manner so that the image sensor 192 is electrically connected to appropriate circuitry of the PCBA 228 via the first and second conductive traces 176, 180. For instance, the first opposing surface 232 of the PCBA 228 may include first and second conductive pads 248, 252 that are appropriately interconnected to the circuitry of the PCBA 228 and that are spaced to align with the third portions 190 of the first and second conductive traces 176, 180 adjacent the second end 116 of the tubular body 108.

Any appropriate conductive material (not shown) (e.g., anisotropic conductive film (ACF), anisotropic conductive paste (ACP), other conductive epoxy, etc.) may be applied to the first and second conductive pads 248, 252 and/or the third portions 190 of the first and second conductive traces 176, 180 adjacent the second end 116 of the tubular body 108. In this regard, the third portions 190 of the first and second conductive traces 176, 180 can be aligned with and placed in contact with the conductive pads 248, 252 of the PCBA 228 (or vice versa) so that upon curing of the conductive epoxy or other material, a secure electrical connection exists between the PCBA 228 and the image sensor 192. In one variation, the third portion 190 of the first and second conductive traces 176, 180 may be removed so that the second portions 188 of the first and second conductive traces 176, 180 adjacent the second end 116 of the tubular body 108 can be directly interconnected to the first and second conductive pads 248, 252 via the conductive epoxy or other material.

With continued reference to FIG. 2, it can be seen that due to mounting of the image sensor 192 to the projection 130 and electrical interconnection of the image sensor 192 to the PCBA 228 via the first and second conductive traces 176, 180 (i.e., instead of electrically mounting the image sensor 192 directly to the first opposing surface 232 of the PCBA 228), the image sensor 192 is separated from the PCBA 228. That is, there is additional real estate or surface area on the PCBA 228 to which other dies and/or components can be electrically mounted. In one arrangement, another die or die piece 260 (e.g., for a JPEG chip) having first and second opposing surfaces 261, 262 may be mounted over and electrically connected to the first opposing surface 232 of the PCBA 228. For instance, before mounting of the housing 104 onto the PCBA 228 as discussed above, first and second conductive stud bumps 264, 268 with corresponding layers of NCP 272 on the second opposing surface 262 of the die 260 may be aligned with corresponding third and fourth conductive pads 276, 280 disposed on the first opposing surface 232 of the PCBA 228 (and/or additional stud bumps and corresponding conductive pads). A thermo-compression bonding process (e.g., as part of a flip chip process) may then be performed to electrically interconnect and mount the die 260 to the PCBA 228. The housing 104 and electrically interconnected image sensor 192 may then be mounted over and electrically connected to the PCBA 228 in a manner so that the die 260 is received in the second housing cavity 172 and occupies at least a portion of the space 256. That is, as assembled, the die 260 may be disposed between the image sensor 192 and the PCBA 228.

Figure 3:
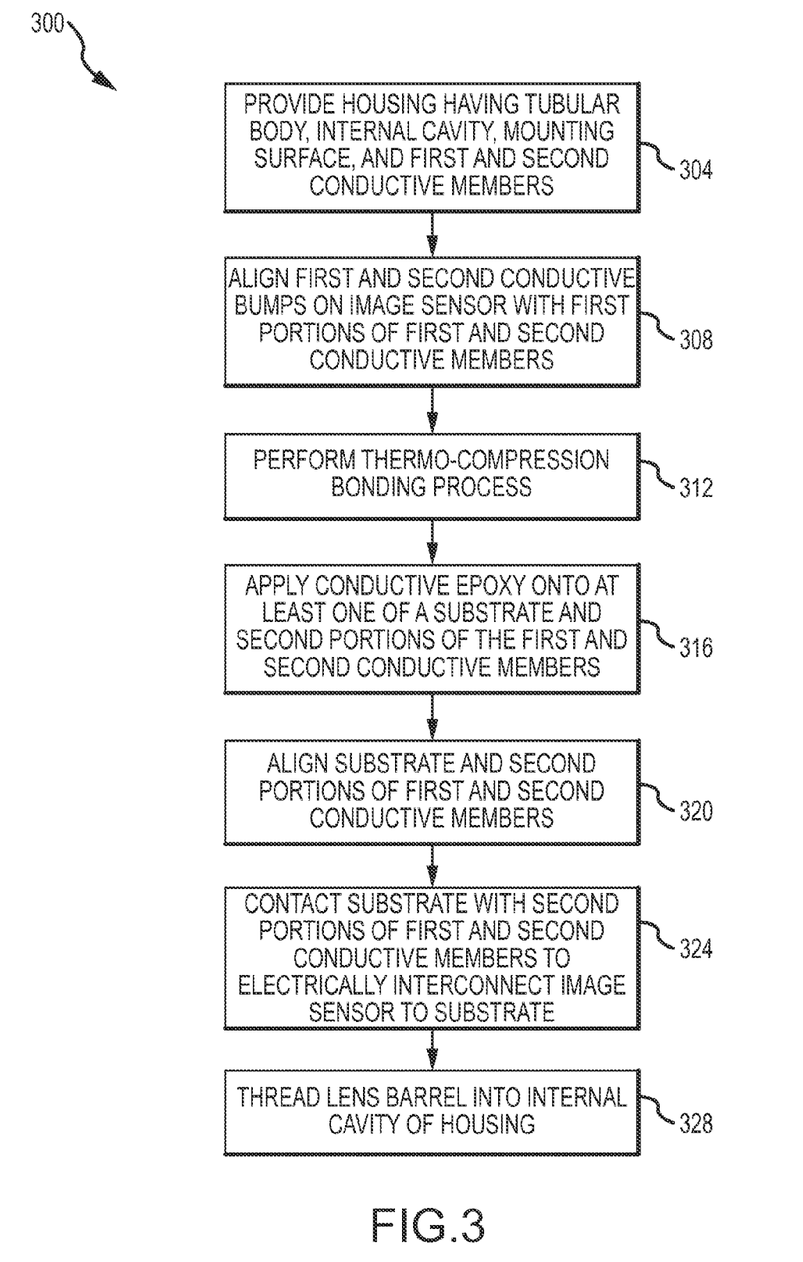
FIG. 3 is a flow diagram illustrating a method of fabricating a camera module.

Turning now to FIG. 3, it may be useful to briefly discuss one method 300 of fabricating the module 100 although it should be understood that at least some of the various steps need not necessarily be performed in the order shown in FIG. 3. Rather, the illustrated method 300 has merely been provided to assist the reader in understanding one manner in which the module 100 may be constructed. Furthermore, numerous additional or alternative steps may be performed all of which are encompassed within the scope of the present disclosure. The method 300 may provide 304 a housing 104 having a tubular body 108, an internal cavity 128, a mounting surface 131 and first and second conductive members or traces 176, 180. Thereafter, the method 300 may align 308 first and second conductive bumps or studs 212, 216 of an image sensor 192 with first portions 184 of the first and second conductive traces 176, 180 and perform 312 a thermo-compression bonding process. In this regard, the aligning 308 and performing 312 may entail a flip chip connection process of the image sensor 192 onto the mounting surface and first portions 184 of the first and second conductive members 176, 180. At this point, the image sensor 192 is interconnected to the housing 104 in a manner that is independent of a PCBA or other substrate.

The method 300 may also apply 316 a conductive epoxy or other material to at least one of a substrate or PCBA 228 (e.g., to conductive pads on the PCBA 228) and second portions 188 of the first and second conductive traces 176, 180, align 320 the substrate or PCBA 228 and second portions 188 of the first and second conductive traces 176, 180, and contact 324 the substrate or PCBA 228 and second portions 188 of the first and second conductive traces 176, 180 to electrically interconnect the image sensor 192 to the substrate or PCBA 228. The method 300 may then thread 328 a lens barrel 132 into the internal cavity 128 of the housing 104. As discussed previously, another die 260 may be electrically interconnected to the PCBA 228 (e.g., via direct mounting of the die 260 over one of opposing first and second surfaces 232, 236 of the PCBA 228) before the housing 104 and PCBA 228 are interconnected such that the die 260 is disposed between the image sensor 192 and the PCBA 228.

The module 100 provides numerous advantages over previous camera modules. One advantage is that by electrically interconnecting the image sensor 192 to the PCBA 228 so that it is spaced or separated from the PCBA 228, additional real estate is opened up or otherwise available on the first opposing surface 232 of the PCBA 228 for use by other components such as by die 260 (e.g., as compared to the situation in FIG. 1 whereby the image sensor die 54 is mounted directly over the first opposing surface 46 of the PCBA 42). As shown, this is accomplished by mounting the image sensor 192 to the projection(s) 130 and over the first and second conductive traces 176, 180 so that the image sensor 192 is in electrical interconnection with the PCBA 228.

Furthermore, specifically mounting the image sensor 192 to the projection 130 presents numerous benefits. One benefit is that as mounting of the image sensor 192 to the projection 130 locates the imaging chip 208 closer to the lens element 136 (e.g., compared to when the image sensor is spaced from the projection 130), the focal length between the lens element 136 and the imaging chip 208 is reduced and a corresponding reduction in the degree of tilt management advantageously results. As one example, mounting of the image sensor 192 to the projection 130 may locate the imaging chip 208 about 0.50 mm from the lens element 136 along the axis 142. Another benefit is that the thickness of the module 100 (e.g., the distance from the second opposing surface 236 of the PCBA 228 to the first end 112 of the tubular body 108, or even to the base 140 of the lens barrel 132) can be reduced due to the more efficient use of the space within the second housing cavity 172 which increases the ability of the module 10 to be incorporated into consumer products of ever-decreasing size. As just one example, the arrangements disclosed herein may allow the distance from the second opposing surface 236 of the PCBA 228 to the first end 112 of the tubular body 108 to be about 1.0 mm.

A still further benefit is that mounting of the image sensor 192 to the housing 104 in a manner that is separate from mounting of the PCBA 228 to the housing 104 advantageously reduces or even eliminates the degree to which the image sensor 192 is at the mercy of the PCBA 228 in relation to alignment of the imaging chip 208 with the lens element 136 along axis 142. As discussed previously, the stud bumps 212, 216, first portions 184 of the first and second conductive traces 176, 180, etc. can be arranged so that upon alignment and interconnection (e.g., using a flip chip process), the imaging chip 208 may be substantially precisely aligned with the lens element 136 along axis 142 (e.g., so that the lens element 136 and imaging chip 208 are symmetrically disposed about axis 142). As a result, the tolerances associated with mounting of the PCBA 228 to the housing 104 can advantageously be relaxed.

Many deviations may be made from the specific embodiments disclosed in the specification without departing from the spirit and scope of the invention. In one arrangement, the conductive traces need not necessarily extend all the way to the second end 116 of the tubular body 108. For instance, the inner surface 120 of the tubular body 108 in the second housing cavity 172 could include a series of "steps" that progressively move closer to the outer surface 124 of the tubular body 108. In this example, conductive traces could be appropriately embedded in the inner surface 120 and have exposed portions or pads in at least some of the steps. Here, the PCBA 228 could be electrically mounted to one of the "internal" steps instead of at the end 116 of the tubular body 108 as shown in FIGS. 2-3 in a manner so that the first opposing surface 232 of the PCBA 228 is still available for the mounting of other components (e.g., such as die 260). Further, some embodiments envision that the conductive traces need not be exposed along the entire portion of the inner surface 120 of the tubular body 108. For instance, the MID process discussed previously may serve to completely embed one or more portions of the conductive traces within the tubular body 108 (e.g., those portions where an exposed contact portion is not needed). Other arrangements are also envisioned and encompassed within the scope of the present disclosure.

Any of the embodiments, arrangements, or the like discussed herein may be used (either alone or in combination with other embodiments, arrangement, or the like) with any of the disclosed aspects. Merely introducing a feature in accordance with commonly accepted antecedent basis practice does not limit the corresponding feature to the singular (e.g., indicating that the device includes "the lens element" alone does not mean that the device includes only a single lens element). Moreover, any failure to use phrases such as "at least one" also does not limit the corresponding feature to the singular (e.g., indicating that a container includes "an imaging chip" alone does not mean that the container includes only a single imaging chip). Use of the phrase "at least generally," "at least partially," "substantially" or the like in relation to a particular feature encompasses the corresponding characteristic and insubstantial variations thereof. For example, a component that is "substantially aligned" relative to something else covers both an insubstantial variation of the component being aligned in addition to the component being aligned. Finally, a reference of a feature in conjunction with the phrase "in one embodiment" does not limit the use of the feature to a single embodiment.

While the invention has been illustrated and described in detail in the drawings and foregoing description, such illustration and description is to be considered as exemplary and not restrictive in character. For example, certain embodiments described hereinabove may be combinable with other described embodiments and/or arranged in other ways (e.g., process elements may be performed in other sequences). Accordingly, it should be understood that only the preferred embodiment and variants thereof have been shown and described and that all changes and modifications that come within the spirit of the invention are desired to be protected.

What is claimed is:

1. A camera module for use in electronic devices, comprising:
   a housing comprising generally opposing first and second ends, opposing first and second portions, wherein the first portion comprises the first end, an outer surface, an inner surface, and a first housing cavity that is surrounded by the inner surface, and wherein the second portion comprises the second end, an outer surface, an inner surface that includes a series of steps that progressively move closer to the outer surface of the second portion, and a second housing cavity that is surrounded by the inner surface;
   a lens barrel comprising at least one lens element disposed therein, wherein the lens barrel is interconnected to the first portion of the housing in a manner such that the lens barrel is able to move into and extend further out from the first portion of the housing, and wherein the at least one lens element is receivable within the first housing cavity;
   first and second conductive traces extending along the inner surface of the second portion of the housing, wherein a portion of each of the first and second conductive traces is embedded within the inner surface of the second housing cavity such that the embedded portion is not exposed to the second housing cavity;
   a plurality of die pieces comprising at least one die piece having an imaging chip, wherein the die pieces are all disposed within the second housing cavity and the at least one die piece is electrically interconnected to the first and second conductive traces; and
   a substrate having a first side and electrically interconnected to the first and second conductive traces and separated from the at least one die piece, wherein all of the plurality of die pieces are electrically coupled to the first side of the substrate.

2. A camera module as set forth in claim 1, wherein the at least one die piece comprises a first surface facing the lens element and an opposing second surface facing the substrate, wherein the at least one die piece is electrically interconnected to the first and second conductive traces via respective first and second conductive components extending between the first opposing surface and the first and second conductive traces.

3. A camera module as set forth in claim 2, wherein the first and second conductive components comprise first and second stud bumps.

4. A camera module as set forth in claim 2, wherein the imaging chip is disposed over the first opposing surface between the first and second conductive components.

5. A camera module as set forth in claim 2, wherein the plurality of die pieces include a second die piece comprising a first surface facing the lens element and an opposing second surface facing the substrate, wherein the second die piece is electrically interconnected to the substrate via third and fourth conductive components extending between the second opposing surface and the substrate.

6. A camera module as set forth in claim 5, wherein the third and fourth conductive components comprise third and fourth stud bumps.

7. A camera module as set forth in claim 5, wherein the second die piece is disposed between the first die piece and substrate.

8. A camera module as set forth in claim 7, wherein the second die piece is spaced from the first die piece.

9. A camera module as set forth in claim 1, wherein each of the lens element, imaging chip and substrate are generally aligned with an axis of the lens element.

10. A camera module as set forth in claim 9, wherein each of the lens element, imaging chip and substrate is generally symmetrically disposed about the axis.

11. A camera module as set forth in claim 1, wherein a portion of each of the first and second conductive traces is fully embedded within the inner surface of second cavity of the housing.

12. A camera module as set forth in claim 11, wherein each of the first and second conductive traces is at least partially free of exposure via the inner surface.

13. A camera module as set forth in claim 1, wherein the housing is a molded interconnect device (MID).

14. A camera module for use in electronic devices, comprising:
   a housing comprising:
      a tubular body having opposing first and second ends, opposing inner and outer surfaces, and an internal cavity surrounded by the inner surface, wherein a portion of the inner surface includes a series of steps that progressively move closer to the outer surface; and
      a ledge extending from the inner surface into the internal cavity to form first and second portions of the internal cavity that are respectively bordered by the first and second opposing ends of the tubular body and the ledge;
   an image sensor disposed within the first portion and interconnected to the ledge;
   a substrate having a first side facing the first portion and interconnected to the first end;
   a lens barrel comprising at least one lens element disposed therein, wherein the lens barrel is interconnected to the second portion of the housing in a manner such that the lens barrel is able to move into and is also able to extend further out from the second portion of the housing; and
   a die disposed within the first portion between the image sensor and the substrate,
   wherein both the image sensor and the die are electrically coupled to the first side of the substrate via a first conductive trace and a second conductive trace that include portions that are embedded within the inner surface such that the embedded portions are not exposed to the internal cavity.

15. A camera module as set forth in claim 14, wherein each of the first and second conductive traces follows a contour of the inner surface of the tubular body and the ledge.

16. A camera module as set forth in claim 15, wherein a portion of each of the first and second conductive traces is fully embedded in the housing.

17. A camera module as set forth in claim 16, further including:
   first and second conductive components respectively interconnecting the first and second conductive traces and the image sensor; and
   third and fourth conductive components respectively interconnecting the die and the substrate.

18. A camera module as set forth in claim 17, wherein each conductive component is a stud bump.

19. A camera module as set forth in claim 14, wherein the tubular body includes a rectangular cross-section adjacent the first portion of the internal cavity and a circular cross-section adjacent the second portion of the internal cavity.

20. A camera module for use in electronic devices, comprising:

a housing comprising generally opposing first and second ends, opposing first and second portions, wherein the first portion comprises the first end, an outer surface, an inner surface, and a first housing cavity that is surrounded by the inner surface, and wherein the second portion comprises the second end, an outer surface, an inner surface that includes a series of steps, and a second housing cavity that is surrounded by the inner surface;

a lens barrel comprising at least one lens element disposed therein, wherein the lens barrel is interconnected to the first portion of the housing in a manner such that the lens barrel is able to move into and extend further out from the first portion of the housing, and wherein the at least one lens element is receivable within the first housing cavity;

first and second conductive traces extending along the inner surface of the second portion of the housing, wherein a first portion of each of the first and second conductive traces is embedded but not exposed along the inner surface of the second housing cavity, and wherein a second portion and a third portion of each of the first and second conductive traces are embedded and exposed along the inner surface of the second housing cavity to make electrical contact with contact pads, and wherein the first portion is between the second and third portions of each of the first and second conductive traces;

a plurality of die pieces comprising at least one die piece having an imaging chip, wherein the die pieces are all disposed within the second housing cavity and the at least one die piece is electrically interconnected to the first and second conductive traces; and a substrate having a first side and electrically interconnected to the first and second conductive traces and electrically mounted to one of the steps and separated from the at least one die piece, wherein all of the plurality of die pieces are electrically coupled to the first side of the substrate.

21. A camera module for use in electronic devices, comprising:

a housing comprising:
  a tubular body having opposing first and second ends, opposing inner and outer surfaces, and an internal cavity surrounded by the inner surface, wherein a portion of the inner surface includes a series of internal steps; and
  a ledge extending from the inner surface into the internal cavity to form first and second portions of the internal cavity that are respectively bordered by the first and second opposing ends of the tubular body and the ledge;

an image sensor disposed within the first portion and interconnected to the ledge;

a substrate having a first side facing the first portion and interconnected to the first end and electrically mounted to one of the internal steps;

a lens barrel comprising at least one lens element disposed therein, wherein the lens barrel is interconnected to the second portion of the housing in a manner such that the lens barrel is able to move into and extend further out from the first portion of the housing, and wherein the at least one lens element is receivable within the first housing cavity; and a die disposed within the first portion between the image sensor and the substrate;

wherein both the image sensor and the die are electrically coupled to the first side of the substrate.

* * * * *